Dec. 22, 1959 R. N. HALL 2,918,396

SILICON CARBIDE SEMICONDUCTOR DEVICES AND METHOD OF PREPARATION THEREOF

Filed Aug. 16, 1957

Inventor:
Robert N. Hall,
by Paul A. Frank
His Attorney.

United States Patent Office 2,918,396

Patented Dec. 22, 1959

2,918,396

SILICON CARBIDE SEMICONDUCTOR DEVICES AND METHOD OF PREPARATION THEREOF

Robert N. Hall, Schenectady, N.Y., assignor to General Electric Company, a corporation of New York Application August 16, 1957, Serial No. 678,739

16 Claims. (Cl. 148—1.5)

Figure 1:
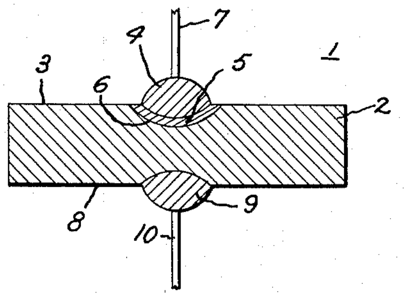

The present invention relates to semiconductor devices and fabrication methods therefor. More particularly the invention relates to silicon carbide semiconductor devices and methods of preparation thereof.

It is well known that extremely useful signal translating devices such as rectifiers and transistors may be provided in the form of semiconductor bodies such as germanium or silicon containing at least two regions of opposite conductivity type separated by a rectifying barrier or P–N junction. Two such P–N junctions separated by a very thin intermediate or base region comprise the heart of the junction transistor. In this device, minority conduction carriers are injected into the base region at one P–N junction and migrate by diffusion to the other junction to change the conductivity characteristics thereof. This mechanism permits the generation, amplification and translation of electrical signals.

Rectifiers and transistors fabricated from semiconductors such as germanium and silicon, although quite satisfactory for most purposes, do not function effectively at elevated temperatures. Thus, for example, when germanium semiconductor devices are raised to a temperature in excess of 150° C. the conductivity characteristics of the devices tend to become intrinsic. That is to say, at such temperatures, the number of thermally excited conduction carriers markedly increases. Under these conditions P–N junctions tend to lose their asymmetrical conductive characteristics. Additionally, at such high temperatures in transistors, minority carrier injection processes cease to control the conductivity characteristics of the devices. In silicon semiconductor devices, the same effects occur at temperatures in excess of 250° C.

Accordingly, for high temperature operation, it is desirable that semiconductor devices be fabricated from a semiconductor which remains extrinsic at high temperatures. Silicon carbide is such a semiconductor, remaining extrinsic at temperatures up to 1000° C. Due to its high melting point and other physical properties, however, silicon carbide is an extremely difficult material to work with, and many physical processes which are simple and straightforward utilizing germanium and silicon are difficult if not impossible utilizing silicon carbide.

One obstacle which has heretofore hampered the production of silicon carbide semiconductor devices has been the inability to form alloyed electrical contacts, especially rectifying contacts, having good electrical and mechanical properties, to silicon carbide crystals.

Accordingly, one object of the present invention is to provide an improved process for forming alloyed electrical contacts to silicon carbide crystals.

Another object of the invention is to provide an improved process for forming rectifying alloyed and recrystalized junctions in silicon carbide crystals.

A further object of the invention is to provide improved high temperature semiconductor devices.

In accord with the present invention, I form electrical contacts to silicon carbide crystals by contacting the silicon carbide with an alloy of silicon and a significant activator material from group III or group V of the periodic table, and maintain the crystals at an elevated temperature for an appropriate time to cause the formation of a ternary molten phase. As the molten phase cools, stoichiometric silicon carbide-containing conductivity inducing atoms of the group III or group V material recrystallizes upon the unmelted silicon carbide. The presence of the silicon in the molten phase prevents the precipitation of free carbon from the melt due to the great affinity of group III and group V materials for silicon. It is this precipitated carbon which is believed responsible for the poor rectifying contacts formed to silicon carbide in attempts to alloy therewith of a group III or group V material only.

Figure 2:
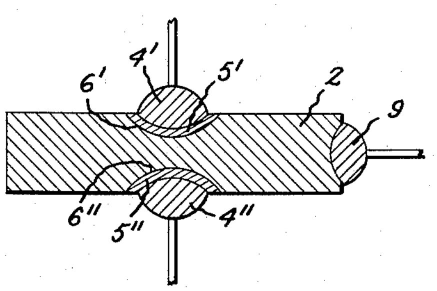
Figure 3:
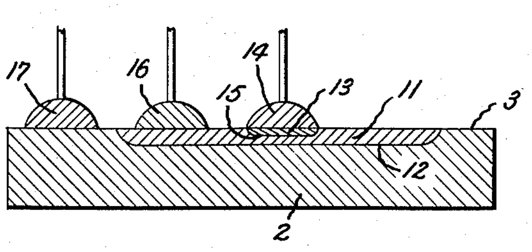

The novel features believed characteristic of the invention are set forth in the appended claims. The invention itself, together with further objects and advantages thereof may best be understood by reference to the following description, taken in connection with the accompanying drawing, in which:

Figure 1 represents a P–N junction rectifier constructed in accord with one feature of the invention, Figure 2 represents a junction transistor constructed in accord with another feature of the invention, and Figure 3 represents a junction transistor constructed in accord with still another feature of the invention.

Silicon carbide possesses a diamond crystal lattice structure comprising alternate atoms of silicon and carbon which is quite similar to the crystal lattice structure of germanium and silicon. Accordingly, the same materials which function to influence the conductivity characteristics of germanium and silicon may, if soluble in silicon carbide, be expected to act as donors and acceptors in silicon carbide crystals. One would expect, therefore, that rectifying and non-rectifying contacts could be made to silicon carbide crystals by the alloying and recrystallization process. In this process a quantity of a chosen activator impurity is placed in contact with a crystal of the semiconductor, and the semiconductor and impurity are raised to, and maintained at, a suitable temperature for a sufficient length of time to cause the activator to melt and dissolve a portion of the semiconductor. Upon cooling of the molten activator-semiconductor alloy, the semiconductor recrystallizes upon the undissolved portion of the crystal. The recrystallized region then contains minute quantities of the activator impurity and possesses conductivity characteristics induced by the particular activating impurity utilized. If the activator is a donor such as arsenic, antimony or phosphorus and the semiconductor is P-type or if the activator impurity is an acceptor such as boron, aluminum, gallium or indium, and the semiconductor is N-type, a P–N junction rectifying barrier is formed.

With silicon carbide, however, the simple alloying and recrystallization process, described above, does not function to cause the formation of good alloyed recrystallized P–N junctions utilizing the conventional acceptor activators of group III of the periodic table and the conventional donor activators of group V of the periodic table. The contacts formed between donor or acceptor activator materials and silicon carbide crystals by conventional methods, as briefly described above, possess poor mechanical characteristics and fracture from the main body of the silicon carbide quite readily. Additionally, donor contacts made to P-type silicon carbide and acceptor contacts made to N-type silicon carbide by this method do not possess good rectifying characteristics nor do donor contacts made to N-type silicon carbide crystals, or acceptor contacts made to P-type silicon carbide crystals form good ohmic contacts.

I have discovered that the inability to form good rectifying and ohmic contacts with silicon carbide crystals by the alloying thereto of group III or group V activator elements, is due to a departure from stoichiometry in the recrystallized silicon carbide layer. More specifically, when a group III or group V activator material is melted while in contact with a silicon carbide crystal, the donor or acceptor, having a greater affinity for silicon than for carbon or silicon carbide, selectively dissolved silicon, thus releasing free carbon. When the molten material in contact with the silicon carbide crystal cools and recrystalizes, it is found that, although a region of recrystallized silicon carbide is formed underneath the melt at the point where it wets the silicon carbide, a layer of carbonaceous material is interposed between the silicon carbide crystal and the solidified mass of activator material. This layer of carbonaceous material effectively prevents the attainment of either good rectifying or non-rectifying characteristics from the contact so formed. Additionally, the carbonaceous material, being brittle, prevents a strong mechanical bonding between the donor or acceptor activator material and the silicon carbide.

Although rectifying alloy contacts made to silicon carbide crystals by the fusing thereto of acceptor or donor materials alone, do show some rectification characteristics, such contacts are of little practical utility. The reverse characteristics of such rectifying contacts are poor, since they invariably exhibit extremely low peak inverse voltages. Thus, for example, contacts made in this manner have exhibited a maximum peak inverse voltage of approximately 6 volts. With the application of greater voltages in the reverse direction to these contacts, high currents are passed. Such contacts, therefore, cannot be used in the formation of silicon carbide rectifiers. The contacts made to silicon carbide crystals by fusing thereto a donor or acceptor material alone are believed to be merely metal-to-semiconductor contacts as opposed to alloyed and recrystallized P–N junction type contacts. As evidence of this, it has been found that when biased in the forward direction, such contacts do not exhibit any visible light emission. Contacts made in accord with the present invention, on the other hand, which contacts definitely are alloyed and recrystallized P–N junction type contacts, exhibit strong luminescence when biased in the forward direction. This luminescence is known as recombination radiation, and is emitted by the recombination if injected minority carriers with majority carriers in the junction region. The absence of recombination radiation in contacts made by fusing donor or acceptor materials alone to silicon carbide crystals, indicates the absence of the injection of minority carriers, and is one explanation why transistor devices, which require for their operation the injection of minority carriers into a base region, cannot be formed utilizing such contacts.

In accord with the present invention, I provide electrical contacts to silicon carbide semiconducting crystals having good electrical and mechanical properties by fusing to the silicon carbide crystal a small quantity of an alloy of silicon and a chosen donor or acceptor activator material to form a recrystallized, conductivity-modified region of silicon carbide and a good electrical and mechanical bond between this layer of silicon carbide and the frozen silicon-activator alloy. The success in attaining contacts in accord with the present invention is due to the fact that the free silicon present in the fused alloy maintains stoichiometry in the recrystallized layer of silicon carbide and prevents the formation of free carbon when the donor or acceptor activator preferentially dissolves the silicon of the silicon carbide. Thus, stoichiometry is maintained at all times, and the recrystallized, conductivity-modified region of silicon carbide is in direct contact with the frozen activator alloy. In accord with the present invention, I am able to form rectifying contacts to N-type silicon and ohmic contacts to P-type silicon using alloys of silicon with aluminum or boron of group III of the periodic table. Although ohmic contacts may be formed utilizing a silicon-gallium or silicon-indium alloy with P-type silicon carbide, attempts to form rectifying contacts to N-type silicon carbide with a silicon-gallium or silicon-indium alloy have not been successful, probably due to the large atomic diameters of gallium and indium and their consequent relatively low solubility in solidified silicon carbide. I am also able to form rectifying contacts to P-type silicon carbide and ohmic contacts to N-type silicon carbide utilizing an alloy of silicon and phosphorus or arsenic. Although ohmic contacts may be made to N-type silicon carbide utilizing an alloy of antimony and silicon, the large atomic diameter of antimony and its relatively low solubility in solid silicon carbide prevents the formation of efficient rectifying contacts to silicon carbide utilizing this alloy.

Although the silicon carbide utilized in the formation of devices in accord with the present invention should be of relatively high purity, it should not be perfectly pure silicon carbide, but should contain small quantities of conductivity-inducing activator impurities so that the silicon carbide crystal itself exhibits either N-type or P-type conductivity. Commercially available silicon carbide which may be purchased from the Carborundum Company or the Norton Company and having a purity of approximately 99.9% may be used in the practice of the invention. Commercial silicon carbide of this type may readily be classified into conductivity types by an observation of its color. N-type crystals are generally green, while P-type crystals are generally blue. N-type crystals are caused to exhibit N-type conductivity characteristics by the inclusion therein of minute quantities of uncompensated donors of group V, principally nitrogen. P-type crystals possess P-type conductivity characteristics because of the presence therein of minute quantities of uncompensated acceptors of group III, principally boron. The silicon carbide crystals used in the practice of the present invention are preferably selected to exhibit a resistivity in the range of approximately .1 to 1 ohm-centimeter, although higher or lower resistivity crystals may be utilized. These crystals are prepared in accord with techniques well known to the art, as for example, in accord with the technique described in an article entitled "Preparation of Single Crystals of Silicon Carbide and Determination of the Kind and Amount of Incorporated Impurities" by J. A. Lely, published in Ber. Beut. Keran. Ges., 32, 231 (1955).

Silicon carbide crystals, as described above, to be used in the practice of the present invention are preferably first etched to remove surface impurities as for example in CP4 etch, which is a mixture of 40 parts by volume concentrated nitric acid, 25 parts concentrated hydrofluoric acid, 25 parts glacial acetic acid and 0.25 part bromine. The silicon carbide crystal, which conveniently may be a rectangular wafer approximately ⅛" square and .005" thick, is placed in a horizontal position in a suitable reaction chamber and a small quantity, for example approximately a few milligrams of an alloy of silicon and a donor or acceptor activator material from group III or group V of the periodic table of the elements respectively is placed on the suface thereof. If the silicon carbide is P-type and it is desired to form a rectifying contact therewith, the impurity alloyed with the silicon should be a donor as for example arsenic or phosphorus. If the silicon carbide is P-type and it is desired to form a non-rectifying contact an acceptor should be utilized as for example boron or aluminum. The materials enumerated above for the formation of rectifying contacts to P-type silicon carbide, form non-rectifying contacts to N-type silicon carbide, while the materials set forth to form non-rectifying contacts to P-type silicon carbide form rectifying contacts with N-type silicon carbide.

If the material alloyed with silicon to form the contact is aluminum, useful contacts may be formed with from 10 to 80% by weight of aluminum in the alloy. Superior contacts are obtained, however, utilizing an alloy of from 30 to 70 parts by weight aluminum, the remainder being silicon. If boron is used as the material alloyed with the silicon the alloy may contain from .01 to 5% by weight of boron, although for the formation of superior contacts from .2 to 2% by weight of boron should be utilized. These materials all form, when properly fused to silicon carbide crystals, rectifying contacts to N-type silicon carbide and non-rectifying contacts to P-type silicon carbide. If phosphorus or arsenic is chosen as the material alloyed with the silicon, the phosphorus or arsenic may be present in from 0.01 to 5% by weight of the alloy, although for superior contacts from .1 to 2% by weight of phosphorus or arsenic should be used. Alloys of phosphorus or arsenic with silicon, when fused to silicon carbide crystals, form rectifying contacts to P-type silicon crystals or non-rectifying contacts to N-type silicon crystals.

The silicon carbide crystal having a small quantity of the activator alloy, as described above, in contact with one surface thereof is then enclosed in a suitable closed chamber which is flushed with a gas which is non-reactive with the alloy and the silicon carbide, at approximately 1 atmosphere of pressure. These gases may be any of the rare gases but preferably comprise helium, argon or hydrogen. The silicon carbide crystal is then raised to a suitable alloying temperature which for most silicon-activator alloys may be from 1550° C. to 2000° C., although using most alloys superior contacts are obtained utilizing a temperature of from approximately 1650° C. to 1800° C. If, however, an alloy of boron and silicon is used contacts may be made at a temperature of 1650° C. to 2200° C. Superior contacts are, however, made using this alloy at a temperature of 1800° C. to 2000° C.

The silicon carbide crystal is maintained at the operating temperature for a time sufficient to raise the entire crystal to that temperature but not so long as to cause excessive evaporation of the silicon-activator alloy. For a ⅛" square 0.005" thick silicon carbide crystal and a quantity of alloy approximately several milligrams in weight, this time may conveniently be from one second to one minute. If, however, the lowest portion of the temperature range is utilized operating temperatures may be maintained for as long as 30 minutes. It should be appreciated, however, that the minimum time increases as the size of the silicon carbide crystal is increased. Additionally, the tolerable maximum time increases as the quantity of alloy utilized is increased. The length of time that the heating cycle is maintained does not effect the formation of the rectifying or ohmic contact to the silicon carbide other than as discussed herein. This is so because the solubility of silicon carbide in alloy melts comprising silicon and donor and acceptor materials is approximately only 1% by weight within the operating temperature range.

As the temperature of the silicon carbide crystal is rasied to the operating range, the silicon-activator alloy wets the silicon carbide crystal and forms a thin lens-shaped puddle. At the completion of the heating cycle, a thin region or stoichiometric silicon carbide is crystallized from the molten alloy in a continuation of the silicon carbide crystal structure. As the molten alloy cools further the droplet of the silicon-activator alloy reforms into a hemispherical globule and freezes. The silicon carbide crystal is then cooled to room temperature, removed from the reaction chamber, and a contact, either rectifying or non-rectifying, depending upon the conductivity type silicon carbide and the activator alloy utilized, is found to be formed between the hemispherical globule of silicon-activator alloy and the silicon carbide crystal. The resistivities of the recrystallized, conductivity-modified regions formed in accord with the present invention have been determined to be approximately 0.01 to 0.1 ohm-centimeters, due to the presence of trace concentrations of excess activator atoms.

A silicon carbide rectifier may be formed by using either a P-type or N-type silicon carbide crystal and forming a rectifying contact to one major surface thereof in accord with the above-described process, and then forming a non-rectifying contact upon the other major surface thereof in accord with the above-described process. Conducting electrodes which may, for example, be nickel or tungsten wires, may be fused into the silicon-activator alloy, either during alloying with the silicon carbide or subsequent thereto. A silicon carbide transistor may be formed by forming two rectifying contacts in close proximity to one another upon a silicon carbide crystal and forming a non-rectifying contact to the main body of the silicon carbide crystal.

In Figure 1 of the drawing there is illustrated a silicon carbide rectifier constructed in accord with the present invention. Rectifier 1 comprises a monocrystalline wafer 2 of silicon carbide which may for example possess N-type conductivity characteristics and a resistivity of approximately 0.5 ohm centimeters. A rectifying contact is made to surface 3 of wafer 2 by means of the above-described process wherein a hemispherical globule 4 of silicon and 47% by weight of aluminum is fused to, and alloyed with, silicon carbide crystal 2 by heating at a temperature of 1700° C. for a period of approximately 1 minute. Upon cooling, a recrystallized region 5 of silicon carbide having P-type conductivity characteristics is formed between the main body of silicon carbide wafer 2 and aluminum-silicon alloy globule 4. Between region 5 and the main body of silicon carbide wafer 2 there exists a P–N junction 6 which possesses good rectifying and light emitting characteristics. A conducting electrode which may for example be a nickel wire 7 is fused within silicon-aluminum globule 4 either during or after the alloying step. A non-rectifying contact is made to the opposite surface 8 of silicon carbide wafer 2 for example by similarly fusing thereto a globule 9 comprising an alloy of silicon and approximately 1% by weight of phosphorus. A conducting electrode 10 is fused to globule 9, either during or after the alloying step. If a P-type silicon carbide crystal is used, and the same contacts made thereto the P–N junction exists at contact 9. I prefer, however, that the non-rectifying contacts on devices made in accord with the present invention be made by high temperature fusion of tungsten, molybdenum or tungsten-molybdenum alloys to the silicon carbide bodies. This process is described and claimed in my concurrently filed copending application Serial No. 678,740, filed August 16, 1957, assigned to the present assignee.

In Figure 2 of the drawing there is illustrated a silicon carbide transistor constructed in accord with the present invention. In Figure 2, wherein like numerals to those used in Figure 1 are utilized to indicate like elements, a first P–N junction 6' is formed by alloying to silicon wafer 2 a first silicon aluminum alloy globule 4' as before and a second P–N junction 6'' is formed by alloying to N-type silicon wafer 2 a second aluminum silicon alloy globule 4'' as before. A non-rectifying contact is formed to wafer 2 by alloying thereto a silicon-phosphorus alloy globule 9 as before. Similarly, N–P–N transistors may be formed by alloying two silicon-donor alloy globules to a P-type silicon carbide crystal and forming an ohmic contact thereto.

Since the solubility of silicon carbide in silicon-activator alloy melts is quite low, the formation of transistors as illustrated in Figure 2 requires the use of a silicon carbide wafer which is extremely thin or has an extremely thin cross section in one portion thereof. This is so because the recrystallized regions of P-type conductivity silicon carbide 5' and 5'' are only a few microns thick and, for proper transistor action, these junctions should be located extremely closely together. Since, however, it is difficult to fabricate transistors using extremely thin wafers of silicon carbide, I prefer to form silicon carbide junction transistors in accord with a modification of the basic alloying process.

In accord with this modified process, an N–P–N transistor as illustrated in Figure 3 of the drawing is formed. In Figure 3 silicon carbide crystal 2, possessing N-type conductivity characteristics, has formed thereupon a first surface-adjacent recrystallized region 11 which extends over a major portion of the surface of wafer 2 and possesses P-type conductivity characteristics. The interface between region 2 and region 11 constitutes a first P–N junction 12. A second recrystallized region 13, smaller in area than first recrystallized region 11, is formed by the alloying to recrystallized region 11 of a silicon-donor alloy globule 14, as is described hereinbefore, to form a second P–N junction 15. The globule comprising the silicon alloy 14 provides an electrical contact to recrystallize N-type region 13. A globule 16 of a silicon-aluminum alloy forms a non-rectifying contact to the exposed surface of first-recrystallized region 11 and a globule 17 of silicon-donor alloy forms a non-rectifying contact to the exposed portion of surface 3 of silicon carbide wafer 2. For operation, contact 16 comprises a base contact whereas contacts 14 and 17 comprise emitter and collector contacts respectively. The transistor of Figure 3 may be made in the P–N–P configuration by utilizing a P-type silicon carbide crystal and interchanging the silicon-donor and silicon-acceptor alloy globules. The formation of the device of Figure 3 proceeds substantially as follows:

Silicon carbide wafer 2 having N-type conductivity characteristics is placed in a horizontal position and a large portion of the upper surface 3 thereof is covered with a quantity of a silicon-activator alloy, as for example an alloy of silicon and 30 to 70% by weight of aluminum. The crystal is then enclosed in a closed chamber, flushed with an atmosphere of a noble gas or hydrogen at approximately one atmosphere pressure, and heated to a temperature sufficient to cause alloying of the silicon alloy with surface 3 of crystal 2, as is disclosed hereinbefore. Crystal 2 is then allowed to cool normally and, during cooling, region 11 of silicon carbide recrystallizes from the liquid-phase to form a recrystallized region 11 of P-type silicon carbide. The silicon-aluminum alloy freezes into a solid mass and is thereafter removed by etching in a suitable etchant, as for example CP4 etch, although any etchant conventionally used with silicon devices may be utilized. After the removal of the silicon-aluminum-alloy, a small quantity of silicon-donor alloy such as, for example, an alloy of silicon and arsenic or phosphorus, as is described hereinbefore, is alloyed with first recrystallized region 11 as is described hereinbefore and cooled to cause the formation of a second recrystallized region 13 having N-type conductivity characteristics. A second P–N junction 14 is located at the interface between first recrystallized region 11 and second recrystallized region 13. Recrystallized region 13 does not penetrate through the entire thickness of recrystallized region 11, short-circuiting the junctions, because the thickness of the recrystallized region depends upon the amount of silicon carbide dissolved by the silicon-activator alloy. Since a much larger quantity of silicon-activator alloy is used to form recrystallized region 11 than is used to form recrystallized region 13, and since the solubility of silicon carbide in these alloys is of the same order, a greater amount of silicon carbide is dissolved initially so that recrystallized region 11 is thicker than the maximum depth of penetration of the second silicon-activator alloys into the region. As a further precaution a lower temperature, for example approximately 200° C. lower, is used during the second alloying step than in the first. The remainder of the silicon-donor alloy recrystallizes into a globule 14 which serves as an electrical contact in region 13. A non-rectifying contact 16 is made to the exposed portion of first recrystallized layer 11 by fusing thereto a globule of silicon-aluminum alloy. A non-rectifying contact 17 is made to the exposed portion of surface 3 of crystal 2 by fusing thereto a small dot of silicon-donor alloy. Suitable electrical contact may be made to contacts 14, 16 and 17 by inserting wires, as for example nickel wire, into the globules while still molten. In operation, contact 17 functions as a base electrode whereas contacts 14 and 16 function as emitter and collector electrodes respectively. With emitter junction 15 biased in the forward direction and collector junction 12 biased in the reverse direction, the transistor of Figure 3 is useful for the amplification and translation of electrical signals.

While the invention and the criteria governing the practice thereof has been set forth in detail hereinbefore, the following specific examples of the practice of the invention are set forth to teach those skilled in the art specific instances in which the invention may be practiced. The following examples are set forth for illustrative purposes only and are not intended to be utilized in a limiting sense.

*Example 1.*—A rectifying contact may be made to N-type silicon carbide substantially as follows: A monocrystalline wafer of 0.5 ohm centimeter, N-type silicon carbide approximately ⅛″ square and 0.005″ thick is etched in CP4 etch and washed in distilled water. The silicon carbide wafer is then placed in a horizontal position in a reaction chamber and 0.2 milligram of an alloy of 47% aluminum, the remainder being silicon, is placed upon the upper surface of the silicon carbide wafer. The reaction chamber is closed and flushed with argon gas at approximately one atmosphere pressure. The temperature of the silicon carbide is raised to approximately 1600° C. by a resistance heater winding, and maintained at this temperature for approximately three seconds. The heating cycle is discontinued and the silicon carbide wafer allowed to cool to room temperature, which occurs in approximately 20 seconds. A nickel wire is fastened to the globule of the aluminum silicon alloy formed upon the surface of the silicon carbide wafer. The contact so formed is found to exhibit asymmetrically conductive characteristics and, at 500° C., passes 2 amperes of current at 4 volts when biased in the forward direction. When biased in the reverse direction at this temperature the contact passes 120 milliamps. of current at 16 volts, indicating a rectification ratio of approximately 70.

*Example 2.*—A rectifying contact may be made to N-type silicon carbide substantially as follows: A monocrystalline wafer of N-type silicon carbide having a resistivity of approximately 0.5 ohm centimeter approximately ⅛″ square and 0.005″ thick is washed in CP4 etch and rinsed in distilled water. The crystal is placed in a horizontal position in a reaction chamber and approximately 0.2 milligram of an alloy consisting essentially of 2 weight percent boron, the remainder being silicon, is placed upon the upper surface thereof. The temperature of the silicon carbide wafer is raised to approximately 2200° C. by a resistance heater and maintained at this temperature for approximately 3 seconds. The silicon carbide wafer is then cooled to room temperature in approximately 20 seconds, and electrical contact made to the silicon-boron globule on the upper surface thereof. When tested at 700° C. the contact so made is found to exhibit asymmetrically conductive characteristics, passing 100 milliamperes at 3 volts, biased in the forward direction, and 1 microampere at 50 volts, biased in the reverse direction.

*Example 3.*—A rectifying contact may be made to P-type silicon carbide substantially as follows: A monocrystalline wafer of silicon carbide approximately ⅛″ square and 0.005″ thick possessing P-type conduction characteristics and a resistivity of approximately 0.5 ohm centimeter is etched in CP4 etch and washed in distilled water. The silicon carbide wafer is then placed in a reaction chamber in a horizontal position and approximately 0.2 milligram of an alloy of one weight percent of phosphorus, the remainder being silicon, is placed upon the upper surface thereof. The reaction chamber is flushed with argon at a pressure of approximately 1 atmosphere. The temperature of the silicon carbide crystal is raised to a temperature of approximately 1500° C. by means of a resistance heater. The temperature is maintained at this value for approximately 3 seconds after which the crystal is cooled to room temperature and, upon examination, exhibits asymmetrically conductive characteristics.

*Example 4.*—A rectifying contact may be made to P-type silicon carbide substantially as follows: A P-type silicon carbide crystal having a resistivity of approximately 0.5 ohm centimeter and dimensions of approximately ⅛" square and 0.005" thick is etched in CP4 etch and washed in distilled water. The crystal is placed in a reaction chamber in a horizontal position and approximately 0.2 milligram of an alloy of 1 weight percent arsenic, the remainder being silicon, is placed on the upper surface thereof. The reaction chamber is closed and flushed with argon at a pressure of approximately 1 atmosphere. The silicon carbide crystal is raised to a temperature approximately 1700° C. and maintained at this temperature for approximately 1 second. After the heating cycle, the crystal is cooled and, upon examination, is found to exhibit asymmetrically conductive characteristics.

*Example 5.*—A non-rectifying contact may be made to P-type silicon carbide substantially as follows: A P-type silicon carbide crystal approximately ⅛" square and 0.005" thick is washed in CP4 etch and rinsed in distilled water. The crystal is placed in a horizontal position in a reaction chamber and approximately 0.5 milligram of an alloy of 47% by weight of aluminum, the remainder being silicon, is placed upon the upper surface thereof. The reaction chamber is closed and flushed with hydrogen at a pressure approximately 1 atmosphere. The temperature of the crystal is raised to approximately 1600° C. and maintained at this temperature for approximately 3 seconds. The crystal is then cooled and, upon examination, the contact formed is found to exhibit ohmic characteristics passing electrical current equally well when biased in both forward and reverse directions.

*Example 6.*—A non-rectifying contact may be made to P-type silicon carbide substantially as follows: A monocrystalline wafer of P-type silicon carbide having a resistivity of approximately 0.5 ohm centimeter and dimensions of approximately ⅛" square and 0.005" thick is washed in CP4 etch and rinsed in distilled water. The crystal is placed in a horizontal position in a reaction chamber and approximately 0.5 milligram of an alloy consisting essentially of 2 weight percent boron, the remainder being silicon, is placed upon the upper surface thereof. The reaction chamber is closed and flushed with hydrogen at 1 atmosphere pressure. The temperature of the silicon carbide crystal raised to a temperature approximately 2200° C. and maintained at this temperature for approximately 3 seconds. After cooling to room temperature, the contact formed between the silicon-boron alloy and the silicon carbide is found to exhibit ohmic characteristics passing electrical current equally well in both forward and reverse directions.

*Example 7.*—A non-rectifying contact may be made to N-type silicon carbide substantially as follows: An N-type silicon carbide crystal having a resistivity of approximately 0.5 ohm-centimeter and dimensions of approximately ⅛" square and 0.005" thick is washed in CP4 etch and rinsed in distilled water. The crystal is placed in a horizontal position in a reaction chamber and approximately 0.5 milligram of an alloy consisting essentially of 1 weight percent of phosphorus, the remainder being silicon, is placed upon the upper surface of the crystal. The reaction chamber is closed and flushed with hydrogen gas at approximately 1 atmosphere pressure. The temperature of the silicon carbide crystal is raised to approximately 1500° C. and maintained at this temperature for approximately 1 second. After the heating cycle, the crystal is cooled to room temperature. When tested, the contact formed exhibits ohmic characteristics, passing electrical current equally well in both forward and reverse directions.

*Example 8.*—A non-rectifying contact may be made to silicon carbide substantially as follows: An N-type silicon carbide crystal having a resistivity of approximately 0.5 ohm centimeter and dimensions of approximately ⅛" square and 0.005" thick is washed in CP4 etch and rinsed in distilled water. The crystal is placed in a horizontal position in a reaction chamber and approximately 0.2 milligram of an alloy consisting essentially of 1 weight percent of arsenic, the remainder being silicon, is placed upon the upper surface thereof. The temperature of the silicon carbide crystal is raised to approximately 1500° C. and maintained at this temperature for 1 second by an electrical resistance heater. After the heating cycle, the crystal is cooled to room temperature. Upon testing, the contact formed exhibits ohmic conduction characteristics, passing electrical current equally well in both forward and reverse directions.

*Example 9.*—An N–P–N silicon carbide junction transistor may be made substantially as follows: A monocrystalline wafer of N-type silicon carbide having a resistivity of approximately 0.5 ohm centimeter and a physical dimension of approximately ⅛" square and 0.005" thick is washed in CP4 etch and rinsed in distilled water. The crystal is placed in a horizontal position in a reaction chamber and a circular area approximately 0.080" diameter is covered with 2 milligrams of an alloy consisting essentially of 47% by weight of aluminum, the remainder being silicon. The reaction chamber is closed and flushed with argon at approximately 1 atmosphere pressure. The temperature of the silicon carbide crystal is raised to a temperature of approximately 1800° C. and maintained at this temperature for approximately 10 seconds. After the heating cycle, the crystal is cooled to room temperature and the reaction chamber is opened and the crystal removed and immersed in a bath of CP4 etch for 1 hour. After one hour in the etch, the crystal is removed and rinsed in distilled water. It is noted that all of the silicon-aluminum alloy has been etched away from the surface thereof. The area to which the silicon-aluminum alloy had been fused, upon testing, exhibits P-type conduction characteristics. The crystal is again mounted in the reaction chamber in a horizontal position. .05 milligram of an alloy consisting essentially of 1 weight percent phosphorus, the remainder being silicon is placed so as to cover a portion approximately .005 mill in diameter, of the P-type surface of the silicon carbide crystal and approximately .05 milligram of 47% silicon-aluminum alloy is placed so as to cover a similar closely spaced, but non-contiguous area also on the P-type surface of the silicon carbide wafer. Approximately 0.2 milligram of an alloy of 1% phosphorus, the remainder being silicon, is placed upon the surface of the silicon carbide crystal, exterior of the P-type surface, contacting the main N-type surface of the body. The reaction chamber is then closed and flushed with argon at approximately 1 atmosphere pressure and the temperature of the silicon carbide wafer is raised by a resistance heater to a temperature of approximately 1600° C. and maintained at this temperature for approximately 1 second. After the heating cycle the crystal is cooled, and electrical contacts are fused into the alloy globules formed upon the surface of the silicon carbide crystal. The silicon-aluminum globule connected to the P-type portion of the surface of the silicon carbide wafer is connected as a base electrode, the silicon-phosphorus contact contacting the N-type portion of the surface of the silicon carbide crystal is connected as a collector electrode and the silicon-phophorus alloy globule contacting the P-type surface of the silicon carbide is connected as an emitter electrode. The device so formed may then be utilized as a transistor device for the generation and amplification of electrical signals.

While the invention has been set forth hereinbefore with respect to certain embodiments thereof, many changes and modifications will immediately become apparent to those skilled in the art. Accordingly, by the appended claims I intend to cover all such changes and modifications as fall within the true spirit and scope of the invention.

What I claim as new and desire to secure by Letters Patent of the United States is:

1. The method of forming good mechanical and electrical contacts to silicon carbide bodies which method comprises, placing a quantity of an alloy formed of silicon and an activator material in contact with a surface of a monocrystalline wafer of silicon carbide, raising the wafer to a temperature below the melting point of silicon carbide but sufficient to cause the alloy to melt and dissolve a surface-adjacent portion of the wafer, and cooling the wafer to cause stoichiometric silicon carbide containing trace concentrations of the activator material to recrystallize upon the unmelted portion of the silicon carbide wafer.

2. The method of forming rectifying contacts having good mechanical and electrical characteristics to silicon carbide bodies which method comprises placing in contact with a surface of a monocrystalline wafer of silicon carbide having one type conductivity characteristics, a quantity of an alloy formed of silicon and a second material comprising an activator for inducing opposite type conductivity characteristics in the silicon carbide, raising the wafer to a temperature below the melting point of silicon carbide but sufficient to cause the alloy to melt and dissolve a surface-adjacent portion of the wafer, and cooling the wafer to cause stoichiometric silicon carbide containing trace concentrations of the activator material to recrystallize upon the unmelted portion of the silicon carbide wafer.

3. The method of forming rectifying contacts having good mechanical and electrical contacts to silicon carbide bodies which method comprises placing a quantity of an alloy formed of silicon and an activator material selected from the group consisting of aluminum and boron in contact with a surface of a monocrystalline wafer of N-type silicon carbide, raising said wafer to a temperature below the melting point of silicon carbide but sufficient to cause the alloy to melt and dissolve a surface-adjacent portion of the wafer and cooling the wafer to cause stoichiometric silicon carbide containing trace concentrations of the activator material to recrystallize upon the unmelted portion of the silicon carbide wafer.

4. The method of forming rectifying contacts having good electrical and mechanical properties to silicon carbide bodies which method comprises placing a quantity of an alloy formed of silicon and a donor activator material selected from the group consisting of arsenic and phosphorus in contact with a surface of a monocrystalline P-type wafer of silicon carbide, raising the wafer to a temperature below the melting point of silicon carbide but sufficient to cause the alloy to melt and dissolve a surface-adjacent portion of the wafer, and cooling the wafer to cause stoichiometric silicon carbide containing trace concentrations of the donor material to recrystallize upon the unmelted portion of the silicon carbide wafer.

5. The method of forming rectifying contacts to silicon carbide bodies having good electrical and mechanical characteristics which method comprises; placing a quantity of an alloy containing 10 to 80% by weight of aluminum, the remainder being silicon, in contact with a surface of an N-type monocrystalline wafer of silicon carbide; raising the temperature of the wafer to a value of 1550° C. to 2000° C. to cause the alloy to melt and dissolve a surface-adjacent portion of the silicon carbide wafer; and cooling the wafer to cause stoichiometric silicon carbide containing trace concentrations of aluminum to recrystallize upon the unmelted portion of the silicon carbide wafer.

6. The method of forming rectifying contacts having good mechanical and electrical characteristics to silicon carbide bodies which method comprises; placing a quantity of an alloy containing from 0.01 to 5 weight percent of boron, the remainder being silicon, in contact with a surface of an N-type monocrystalline wafer of silicon carbide; raising the temperature of said wafer to a value of 1650° C. to 2200° C. to cause the alloy to melt and dissolve a surface-adjacent portion of the silicon carbide wafer; and cooling the wafer to cause stoichiometric silicon carbide containing trace concentrations of boron to recrystallize upon the unmelted portion of the silicon carbide wafer.

7. The method of forming rectifying contacts having good mechanical and electrical characteristics to silicon carbide bodies which method comprises; placing a quantity of an alloy containing .01 to 5% by weight of a donor activator material selected from the group consisting of arsenic, and phosphorus, the remainder being silicon in contact with a surface of a P-type monocrystalline wafer of silicon carbide, raising the wafer to a temperature of from 1550° C. to 2000° C. to cause the alloy to melt and dissolve a surface-adjacent portion of the crystal, cooling the wafer to cause stoichiometric silicon carbide containing trace concentrations of the donor activator material to recrystallize upon the unmelted portion of the silicon carbide wafer.

8. The method of forming rectifying contacts to silicon carbide bodies having good electrical and mechanical characteristics which method comprises; placing a quantity of an alloy containing 30 to 70% by weight of aluminum, the remainder being silicon, in contact with a surface of an N-type monocrystalline wafer of silicon carbide, raising the temperature of the wafer to a value of 1650° C. to 1800° C. to cause the alloy to melt and dissolve a surface-adjacent portion of the silicon carbide wafer; and cooling the wafer to cause stoichiometric silicon carbide containing trace concentrations of aluminum to recrystallize upon the unmelted portion of the silicon carbide wafer.

9. The method of forming rectifying contacts having good mechanical and electrical characteristics to silicon carbide bodies which method comprises; placing a quantity of an alloy containing from .2 to 2% by weight of boron, the remainder being silicon, in contact with a surface of an N-type monocrystalline wafer of silicon carbide, raising the temperature of the wafer to a value of 1800° C. to 2000° C. to cause the alloy to melt and dissolve a surface-adjacent portion of the silicon carbide wafer; and cooling the wafer to cause stoichiometric silicon carbide containing trace concentrations of boron to recrystallize upon the unmelted portion of the silicon carbide wafer.

10. The method of forming rectifying contacts having good mechanical and electrical characteristics to silicon carbide bodies which method comprises; placing a quantity of an alloy containing 0.1 to 2% by weight of a donor activator material selected from the group consisting of arsenic and phosphorus, the remainder being silicon, in contact with a surface of a P-type monocrystalline wafer of silicon carbide; raising the wafer to a temperature of from 1660° C. to 1800° C. to cause the alloy to melt and dissolve a surface-adjacent portion of the wafer; and cooling the wafer to cause stoichiometric silicon carbide containing trace concentrations of the donor activator material to recrystallize upon the unmelted portion of the silicon carbide wafer.

11. The method of forming a silicon carbide junction transistor which method comprises; placing, in contact with a first surface portion of a monocrystalline wafer of silicon carbide of one-conductivity type, a quantity of a first alloy of silicon and a first activator material for inducing opposite-conductivity type characteristics in silicon carbide; raising the wafer to a temperature below the melting point of silicon carbide but sufficient to cause the first alloy to melt and dissolve a first surface-adjacent portion of the wafer; cooling the wafer to cause stoichiometric silicon carbide containing trace concentrations of the first activator material to recrystallize upon the unmelted portion of the silicon carbide wafer forming a first recrystallized surface-adjacent region of opposite-conductivity type silicon carbide; etching the silicon carbide wafer to remove from the surface thereof all traces of the first alloy; placing, upon a second surface portion of the first recrystallized surface-adjacent region of the silicon carbide wafer, smaller in area than the first surface portion a second alloy of silicon and a second activator material for inducing one-conductivity type characteristics in silicon carbide; raising the wafer to a temperature below the melting point of silicon carbide but sufficient to cause the second alloy to melt and dissolve a second surface-adjacent portion of the first recrystallized portion of the wafer; cooling the wafer to cause stoichiometric silicon carbide having one-conductivity type characteristics to be recrystallized upon the unmelted portion of the first recrystallized region of the silicon carbide crystal; forming a non-rectifying contact to the exposed portion of the first recrystallized opposite-conductivity type region of the wafer; and forming a non-rectifying contact to the non-recrystallized one-conductivity type portion of the silicon carbide wafer.

12. The method of forming a silicon carbide N–P–N junction transistor which method comprises; placing a quantity of a first alloy of silicon and an acceptor activator material selected from the group consisting of boron and aluminum upon a first surface portion of an N-type silicon carbide monocrystalline wafer; raising the wafer to a temperature below the melting point of silicon carbide, but sufficient to cause the first alloy to melt and dissolve a first surface-adjacent portion of the wafer; cooling the wafer to cause a first recrystallized region of stoichiometric silicon carbine having N-type conductivity characteristics to recrystallize upon the unmelted portion of the wafer; etching the silicon carbide wafer to remove therefrom all traces of the first alloy; placing upon a second portion of the surface of the first recrystallized region of the silicon carbide wafer, smaller in area than the first surface portion, a quantity of a second alloy of silicon and a donor activator material selected from the group consisting of arsenic and phosphorus; raising the wafer to a temperature below the melting point of silicon carbide, but sufficient to cause the second alloy to melt and dissolve a second surface-adjacent portion of the first recrystallized region of the silicon carbide wafer; cooling the wafer to cause a second recrystallized region of silicon carbide having N-type conductivity characteristics to recrystallize upon the unmelted portion of the first recrystallized region of the silicon carbide wafer; forming a non-rectifying electrical contact to the exposed surface of the first recrystallized P-type silicon carbide region; and forming a non-rectifying electrical contact to the unrecrystallized N-type region of the silicon carbide wafer.

13. The method of forming a P–N–P silicon carbide junction transistor which method comprises; placing a first alloy comprising silicon and a donor activator material selected from the group consisting of arsenic and phosphorus in contact with a first surface portion of a monocrystalline P-type silicon carbide wafer; raising the wafer to a temperature below the melting point of silicon carbide, but sufficient to cause the first alloy to melt and dissolve a first surface-adjacent portion of the wafer; cooling the wafer to cause a first recrystallized region of stoichiometric silicon carbide having N-type conductivity characteristics to recrystallize upon the unmelted portion of the wafer; etching the wafer to remove therefrom all trace of silicon-donor alloy, placing upon a second surface portion of the first recrystallized N-type silicon carbide region, smaller than the first surface portion, a quantity of a second alloy of silicon and an acceptor activator selected from the group consisting of aluminum and boron; raising the wafer to a temperature below the melting point of silicon carbide, but sufficient to cause the second alloy to melt and dissolve a second surface-adjacent portion of the first recrystallized region of the silicon carbide wafer; cooling the wafer to cause a second recrystallized region of stoichiometric silicon carbide having P-type conductivity characteristics to form upon the unmelted portion of the first recrystallized region of the silicon carbide wafer, forming a non-rectifying electrical contact to the exposed portion of the first recrystallized N-type silicon carbide region, and forming a non-rectifying contact to the unrecrystallized region of the P-type silicon carbide wafer.

14. A semiconductor device comprising a body of monocrystalline silicon carbide and opposite conductivity inducing electrode fused thereto, said electrode comprising an alloy of silicon and a material selected from the group consisting of donors and acceptors for silicon carbide.

15. A semiconductor device comprising a body of monocrystalline silicon carbide and an opposite conductivity inducing electrode fused thereto, said electrode comprising silicon and a donor material selected from the group consisting of arsenic and phosphorus.

16. A semiconductor device comprising a body of monocrystalline silicon carbide and opposite conductivity inducing electrode fused thereto, said electrode comprising silicon and an acceptor material selected from the group consisting of aluminum and boron.

References Cited in the file of this patent

UNITED STATES PATENTS

| | | |
|---|---|---|
| 2,821,493 | Carman | Jan. 28, 1958 |
| 2,847,335 | Gremmelmaier et al. | Aug. 12, 1958 |

FOREIGN PATENTS

| | | |
|---|---|---|
| 757,672 | Great Britain | Sept. 19, 1956 |